(12) United States Patent
Weber et al.

(10) Patent No.: US 10,269,896 B2
(45) Date of Patent: Apr. 23, 2019

(54) SEMICONDUCTOR WAFER AND METHOD OF MANUFACTURING SEMICONDUCTOR DEVICES IN A SEMICONDUCTOR WAFER

(71) Applicant: Infineon Technologies Austria AG, Villach (AT)

(72) Inventors: Hans Weber, Bayerisch Gmain (DE); Wolfgang Jantscher, Villach (AT); Hans-Joachim Schulze, Taufkirchen (DE)

(73) Assignee: INFINEON TECHNOLOGIES AUSTRIA AG, Villach (DE)

( * ) Notice: Subject to any disclaimer, the term of this patent is extended or adjusted under 35 U.S.C. 154(b) by 0 days.

(21) Appl. No.: 15/587,896

(22) Filed: May 5, 2017

(65) Prior Publication Data

US 2017/0243938 A1    Aug. 24, 2017

Related U.S. Application Data

(63) Continuation of application No. 15/146,429, filed on May 4, 2016, now Pat. No. 9,653,540.

(30) Foreign Application Priority Data

May 5, 2015 (DE) .......................... 10 2015 106 979

(51) Int. Cl.
*H01L 29/06* (2006.01)
*H01L 21/263* (2006.01)
(Continued)

(52) U.S. Cl.
CPC ........ *H01L 29/0634* (2013.01); *H01L 21/263* (2013.01); *H01L 21/265* (2013.01); *H01L 21/268* (2013.01); *H01L 21/2636* (2013.01); *H01L 21/2686* (2013.01); *H01L 21/26513* (2013.01); *H01L 21/3003* (2013.01);
(Continued)

(58) Field of Classification Search
None
See application file for complete search history.

(56) References Cited

U.S. PATENT DOCUMENTS

5,340,434 A * 8/1994 Takano .................. C30B 15/00
117/21
6,274,439 B1 * 8/2001 Ito ..................... H01L 21/26506
257/E21.335
(Continued)

*Primary Examiner* — Walter H Swanson
*Assistant Examiner* — Kien C Ly
(74) *Attorney, Agent, or Firm* — Slater Matsil, LLP (57) ABSTRACT

A method of manufacturing semiconductor devices in a semiconductor wafer comprises forming charge compensation device structures in the semiconductor wafer. An electric characteristic related to the charge compensation device structures is measured. At least one of proton irradiation and annealing parameters are adjusted based on the measured electric characteristic. The semiconductor wafer is irradiated with protons and annealed based on the at least one of the adjusted proton irradiation and annealing parameters. Laser beam irradiation parameters are adjusted with respect to different positions on the semiconductor wafer based on the measured electric characteristic. The semiconductor wafer is irradiated with a photon beam at the different positions on the wafer based on the photon beam irradiation parameters.

5 Claims, 8 Drawing Sheets

(51) Int. Cl.
*H01L 21/265* (2006.01)
*H01L 21/30* (2006.01)
*H01L 29/78* (2006.01)
*H01L 21/268* (2006.01)
*H01L 21/324* (2006.01)
*H01L 21/67* (2006.01)
*H01L 21/66* (2006.01)
*H01L 29/36* (2006.01)
*H01L 29/32* (2006.01)
*H01L 29/167* (2006.01)

(52) U.S. Cl.
CPC ...... *H01L 21/324* (2013.01); *H01L 21/67103* (2013.01); *H01L 22/20* (2013.01); *H01L 22/34* (2013.01); *H01L 29/167* (2013.01); *H01L 29/32* (2013.01); *H01L 29/36* (2013.01); *H01L 29/7802* (2013.01); *H01L 29/7811* (2013.01); *H01L 29/7816* (2013.01); *H01L 29/7835* (2013.01); *H01L 22/14* (2013.01)

(56) References Cited

U.S. PATENT DOCUMENTS

| | | | |
|---|---|---|---|
| 6,878,997 | B2 | 4/2005 | Pfirsch |
| 8,786,045 | B2* | 7/2014 | Challa ................. H01L 21/3065 257/341 |
| 9,012,980 | B1 | 4/2015 | Schulze |
| 2004/0041225 | A1 | 3/2004 | Nemoto |
| 2009/0181520 | A1* | 7/2009 | Li ........................... H01L 21/78 438/462 |
| 2012/0012837 | A1* | 1/2012 | Yamazaki ......... H01L 27/11517 257/43 |
| 2012/0228634 | A1 | 9/2012 | Sugi |
| 2013/0134478 | A1 | 5/2013 | Nakajima |
| 2013/0140633 | A1 | 6/2013 | Pattanayak |
| 2014/0070369 | A1 | 3/2014 | Kitamura |
| 2014/0242769 | A1* | 8/2014 | Yamada ............ H01L 29/66477 438/289 |
| 2014/0327069 | A1* | 11/2014 | Willmeroth ........... H01L 29/063 257/329 |
| 2015/0311279 | A1* | 10/2015 | Onozawa ......... H01L 29/66333 257/139 |

* cited by examiner

FIG 7E

SEMICONDUCTOR WAFER AND METHOD OF MANUFACTURING SEMICONDUCTOR DEVICES IN A SEMICONDUCTOR WAFER

CROSS-REFERENCE TO RELATED APPLICATION

This application is a divisional application of U.S. application Ser. No. 15/146,429 filed May 4, 2016 and entitled "Semiconductor Wafer and Method of Manufacturing Semiconductor Devices in a Semiconductor Wafer", now U.S. Pat. No. 9,653,540 which issued on May 16, 2017 which claims priority to German Application Serial No. 102015106979.2 filed May 5, 2015 and entitled "Semiconductor Wafer and Method of Manufacturing Semiconductor Devices in a Semiconductor Wafer".

BACKGROUND

Semiconductor devices known as charge compensation or super junction (SJ) semiconductor devices, for example SJ insulated gate field effect transistors (SJ IGFETs) are based on mutual space charge compensation of n- and p-doped regions in a semiconductor substrate allowing for an improved trade-off between area-specific on-state resistance Ron×A and breakdown voltage Vbr between load terminals such as source and drain. Performance of charge compensation of SJ semiconductor devices depends on a lateral or horizontal charge balance between the n-doped and p-doped regions. Process tolerances lead to deviations of a target charge balance, i.e. to a de-tuning of a desired degree of charge balance that may result in an undesirable decrease of device performance such as a reduction in a source to drain breakdown voltage.

It is desirable to improve the trade-off between the area-specific on-state resistance and the blocking voltage of a super junction semiconductor device and to reduce the impact of process tolerances on this trade-off.

SUMMARY

An embodiment refers to a method of manufacturing semiconductor devices in a semiconductor wafer. The method comprises forming charge compensation device structures in the semiconductor wafer. An electric characteristic related to the charge compensation device structures is measured. At least one of proton irradiation and annealing parameters are adjusted based on the measured electric characteristic. The semiconductor wafer is irradiated with protons and annealed based on the at least one of the adjusted proton irradiation and annealing parameters. Photon beam irradiation parameters are adjusted with respect to different positions on the semiconductor wafer based on the measured electric characteristic. The semiconductor wafer is annealed with a photon beam at the different positions on the wafer based on the photon beam irradiation parameters.

According to another embodiment of a semiconductor wafer, the semiconductor wafer comprises a plurality of semiconductor dies. Each of the plurality of semiconductor dies comprises a charge compensation structure including p-doped and n-doped regions arranged consecutively in a semiconductor substrate along a lateral direction. A first dopant species dominates a doping profile of the p-doped regions. A second dopant species dominates a doping profile of the n-doped regions. Each of the plurality of semiconductor dies further comprises hydrogen-related donors in the p-doped and n-doped regions. The hydrogen-correlated donors differ from the second dopant species. A maximum concentration of the hydrogen-related donors in the p-doped regions of a first die of the plurality of semiconductor dies is more than 5% greater than a maximum concentration of the hydrogen-related donors in the p-doped regions of a second die of the plurality of semiconductor dies.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped.

Processing of a semiconductor wafer may result in semiconductor devices having terminal contacts such as contact pads (or electrodes) which allow electrical contact to be made with the integrated circuits or discrete semiconductor devices included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the semiconductor wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

FIGS. 1A to 1E refer to an embodiment of manufacturing semiconductor devices in a semiconductor wafer.

The method comprises forming charge compensation device structures in a semiconductor wafer 105. In the schematic top view of FIG. 1A, a portion of the semiconductor wafer 105 is illustrated. The semiconductor wafer 105 may include a plurality of semiconductor dies 107. Each one of the semiconductor dies 107 may include one of the charge compensation device structures. An area 108 between the semiconductor dies 107 may be used for wafer dicing after completion of wafer processing. Test structures for monitoring process stability may be arranged in the area 108. The test structures may include pn junctions between several or any combination of p-doped regions and n-doped regions. In additional or as an alternative, the test structures may also include resistors for monitoring sheet resistance of the p-doped regions and the n-doped regions. When arranging the test structures in the area 108, measurement of the test structures may be carried out before dicing the semiconductor wafer 105 into singularized semiconductor dies 107.

Figure 1A:
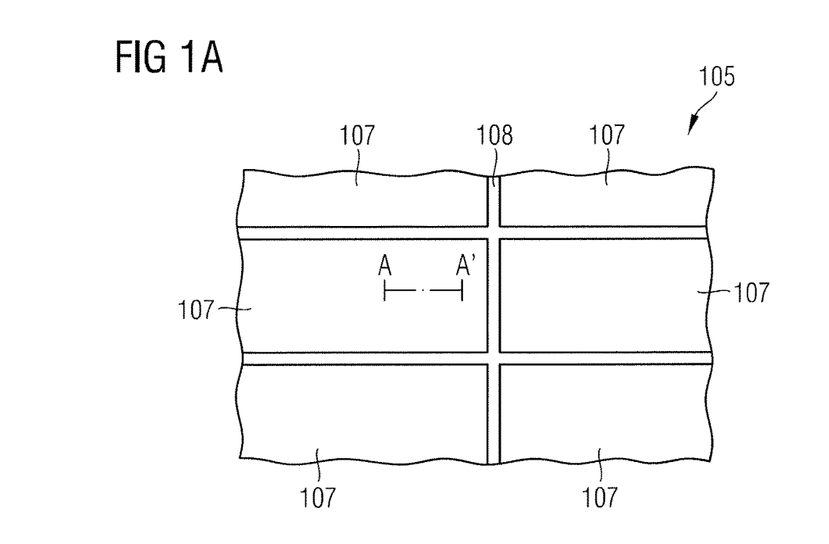
FIGS. 1A to 1F are schematic views illustrating one embodiment of a semiconductor wafer with respect to different process features.
Figure 1B:
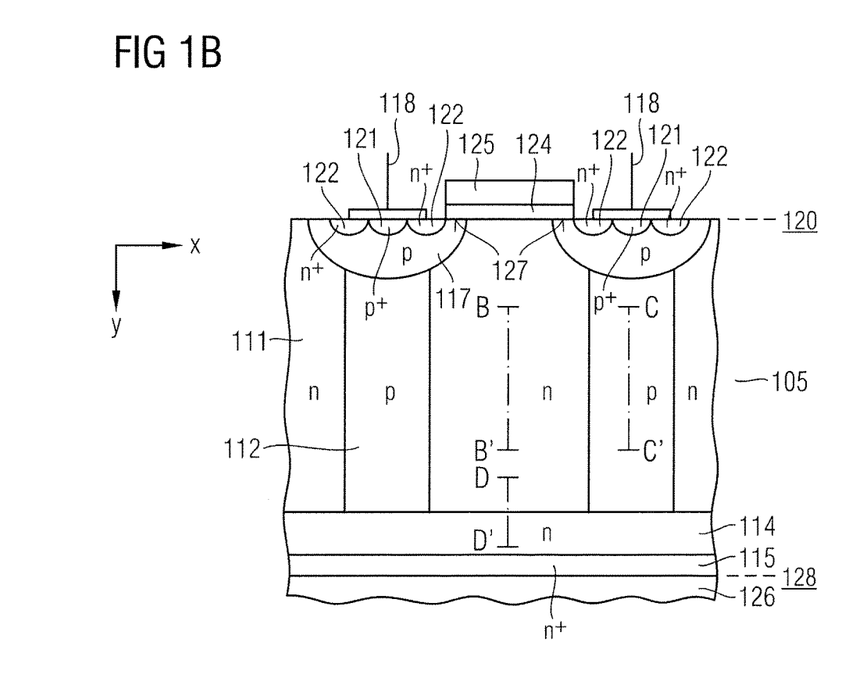

FIG. 1B illustrates one embodiment of a cross-sectional view along line A-A' of the semiconductor die 107 illustrated in FIG. 1A. The semiconductor die 107 includes a charge compensation device structure including alternating n-doped and p-doped regions 111, 112 alternating along a lateral direction x. According to an embodiment, the n-doped regions 111 and the p-doped regions 112 extend in parallel as stripes along a lateral direction perpendicular to the drawing plane of FIG. 1B. According to another embodiment, the p-doped regions 112 constitute separate p-doped pillars or islands surrounded by the n-doped region 111 being a continuous n-doped region with respect to a top view of FIG. 1B. According to another embodiment, the n-doped regions 111 are separate n-doped pillars or islands surrounded by the p-doped region 112 being a continuous p-doped region with respect to a top view of FIG. 1B. A top view of the p-doped islands or n-doped islands may be square-shaped, rectangular, circular or polygonal, for example. The charge compensation device structure may be formed by super junction process technologies such as multiple epitaxy technology and deep trench technology. Also a combination of multiple epitaxy technology and deep trench technology may be used to formed the charge compensation device structure.

In the embodiment illustrated in FIG. 1B, the semiconductor die 107 includes a vertical super junction (SJ) n-channel field-effect transistor (NFET). The vertical SJ NFET includes an optional n-doped field stop zone 114 between the charge compensation device structure and an $n^+$-doped drain region 115. Each one of the p-doped regions 112 adjoins a bottom side of a p-doped body region 117. The p-doped body region 117 is electrically coupled to a source contact 118 at a first side 120 of the semiconductor wafer 105 via an optional $p^+$-doped body contact region 121. $N^+$-doped source regions 122 adjoin the first side 120 and are electrically coupled to the source contact 118. A gate structure including a gate dielectric 124 and a gate electrode 125 is arranged on the semiconductor wafer 105 at the first side 120 and is configured to control a conductivity in a channel region 127 by field effect. Thereby, a current flow between the source contact 118 at the first side 120 and a drain contact 126 at a second side 128 can be controlled. The source and drain contacts 118, 126 may include conductive materials such as metal(s) and/or highly doped semiconductor material(s). The source and drain contacts 118, may be present before the subsequent method features described with respect to FIGS. 1C to 1E below. According to another embodiment, at least one of the source and drain contacts, e.g. the source contact 118 or the drain contact 126 or both contacts 118, 126 will be formed after the method features described with respect to FIGS. 1C to 1E below.

The vertical SJ NFET illustrated in FIG. 1B is one example of a semiconductor device including the charge compensation device structure. Other embodiments may include vertical SJ p-channel FETs, lateral SJ FETs including source and drain contacts at a common side, lateral or vertical insulated gate bipolar transistors (IGBTs), for example.

Figure 1C:
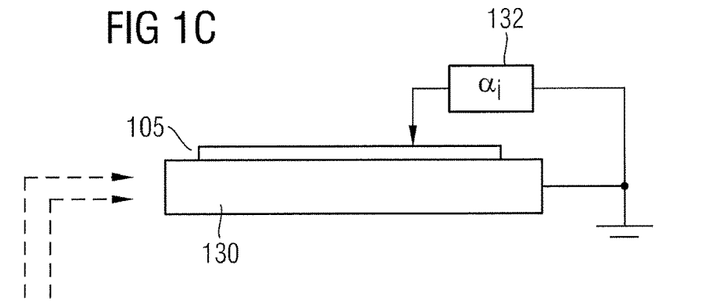

Referring to the schematic view illustrated in FIG. 1C, the method further comprises measuring an electric characteristic $\alpha_i$ related to the charge compensation device structures. The electric characteristic $\alpha_i$ may include a plurality of measurements at different wafer positions, for example. In the embodiment illustrated in FIG. 1C, the semiconductor wafer 105 is arranged on a carrier 130, for example a XY stage and the electric characteristic $\alpha_i$ is measured via a measurement equipment 132. The measurement equipment 132 may include a wafer prober. As an example, the semiconductor wafer 105 may be vacuum-mounted on a wafer chuck and electrically connected via probes brought into electrical contact with the semiconductor wafer 105. When the electric characteristic $\alpha_i$ related to a position of a first die has been measured, the wafer prober moves the semiconductor wafer 105 so that measurement of the electric characteristic of a second die can start. This procedure may be repeated until a desired mapping of measurements across a surface of the semiconductor wafer 105 has been achieved. According to an embodiment, the electric characteristic $\alpha_i$ includes a map of breakdown voltages Vbd between a source and a drain of a SJ FET or between a collector and an emitter of an IGBT, for example. In addition or as an alternative, the electric characteristic $\alpha_i$ may further include a map of an output charge Qoss versus voltage, i.e. an Qoss(V) characteristic. The electric characteristic may be measured between respective electrodes of the SJ semiconductor device of the die under test or with respect to a test structure arranged within an area of a semiconductor die 107 and/or within the area 108 illustrated in FIG. 1A. According to an embodiment, a metal electrode provides electric contact to the test structure but any metal structures are missing in an area of the charge compensation device structure. According to yet another embodiment, the probes are brought into contact with highly doped semiconductor regions of the semiconductor substrate without any intervening metal structures. According to yet another embodiment, metal electrodes and/or a contact support layer, e.g. a highly doped polysilicon layer are arranged on the semiconductor substrate for reducing a contact resistance between the probes and the semiconductor substrate and may be removed before proton irradiation described with respect to FIG. 1D.

The electric characteristic $\alpha_i$ may characterize a charge balance of the charge compensation device structures. Since the charge balance constitutes a reference parameter for correction of an overall charge in the n- and p-doped regions 111, 112, precision of correction can be improved with respect to a correction process having the overall charge in the n- and p-doped regions 111, 112 as the reference parameter for correction.

Based on the electric characteristic $\alpha_i$ related to the charge compensation device structures, proton irradiation and/or annealing parameters are adjusted. According to an embodiment, at least one of number, dose and energy of proton irradiation are adjusted based on the measured value of the electric characteristic $\alpha_i$. According to an embodiment, the adjusted proton irradiation parameters include an implantation dose in a range of $1\times10^{13}$ cm$^{-2}$ and $3\times10^{15}$ cm$^{-2}$, or $5\times10^{13}$ cm$^{-2}$ and $1\times10^{15}$ cm$^{-2}$, or $2\times10^{14}$ cm$^{-2}$ and $8\times10^{14}$ cm$^{-2}$ and an implantation energy in a range of 1.0 MeV and 3.0 MeV. According to an embodiment, the adjusted proton irradiation parameters are configured to shift a charge balance of the charge compensation device structure based on the measured value of the electric characteristic towards or to a target charge balance of the charge compensation device structure. Irradiation of the semiconductor substrate with the adjusted proton irradiation parameters will generate hydrogen-related donors leading to an increase of n-doping in both the n- and p-doped regions 111, 112 of the charge compensation device structure.

Figure 1D:
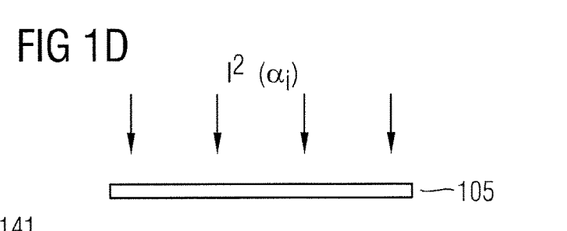

Referring to the schematic view of FIG. 1D, the method further comprises irradiating the semiconductor wafer 105 with protons based on the adjusted proton irradiation parameters (c.f. $I^2(\alpha_i)$ in FIG. 1D). According to an embodiment, the semiconductor wafer 105 is irradiated from the first side, e.g. a front side of the semiconductor wafer 105. At the first side 120 control electrode(s) such as gate electrode(s) may be arranged and electrically coupled to a wiring area. According to another embodiment, the semiconductor wafer 105 is irradiated with protons from the second side 128 opposite to the first side 120. At the second side 128, a drain electrode of a SJ FET or a collector electrode of an IGBT may be arranged. According to yet another embodiment, the semiconductor wafer 105 is irradiated with protons from the first and second sides 120, 128.

Figure 1E:
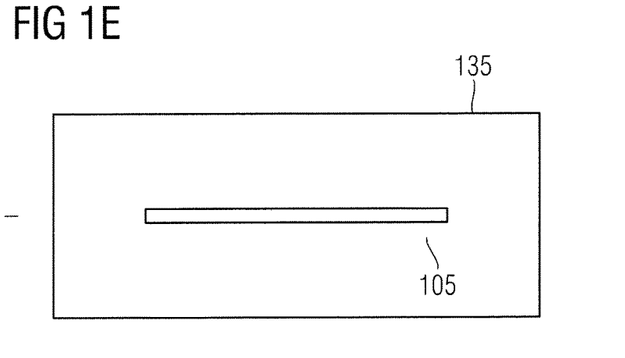

Referring to the schematic view of FIG. 1E, the method further comprises annealing the semiconductor wafer 105. According to an embodiment, annealing is carried out under inert atmosphere or air in an annealing equipment 135 such as a chamber or an oven. Annealing temperatures typically range between 350° C. and 550° C., or between 380° C. and 500° C. Duration of the annealing typically ranges between 30 minutes and 10 hours, e.g. between 1 and 5 hours. A resulting donor concentration and vertical distribution can also be adjusted by annealing temperature and annealing duration.

The doping is effected predominantly in the so-called end-of-range region of the proton implantation, and to a lesser extent in the region radiated through. Annealing of the semiconductor wafer 105 leads to diffusion of the hydrogen into the irradiated area and may also reach the surface radiated through whereby the formation of complexes comprising the hydrogen atoms and the irradiation-induced defects like e.g. vacancies results in the creation of donors, e.g. so-called hydrogen-related donors in this region.

Since at least one of the proton irradiation and annealing parameters are based on the measured electric characteristic $\alpha_i$ related to the charge compensation devices, a precise correction process of charge balance in the n-doped and p-doped regions 111, 112 of the charge compensation device structure can be carried out with respect to an overall depth of a voltage absorbing volume of the charge compensation device structure, e.g. with respect to an overall depth of a drift zone of the charge compensation device. According to an embodiment, the hydrogen-related donors extend over at least 30% of a vertical extension of a drift zone between a first side and a second side of the semiconductor wafer 105. According to another embodiment, a concentration of the hydrogen-related donors is in a range of $1\times10^{13}$ cm$^{-3}$ and $1\times10^{15}$ cm$^{-3}$, or $5\times10^{13}$ cm$^{-3}$ and $8\times10^{14}$ cm$^{-3}$.

As is indicated by a dashed line 141 between FIGS. 1E and 1C, the above-described correction process may be repeated. According to an embodiment, the electric characteristic $\alpha_i$ is measured again as described with respect to FIG. 1C and, depending upon whether the measured electric characteristic $\alpha_i$ is out of a range of tolerance, proton irradiation and annealing as illustrated in FIGS. 1D and 1E may be carried out to increase the number of n-charges in the charge balance of the charge compensation device structure. In case the measured value of the electric characteristic $\alpha_i$ reveals an excess of n-type charges with respect to a target charge balance in the charge compensation device structure, proton irradiation as illustrated in FIG. 1D may be dispensed with and the number of n-type charges in the charge compensation device structure may be lowered by an additional process of annealing the semiconductor wafer 105 as is illustrated in FIG. 1E. Thus, depending upon whether n-type charges or p-type charges dominate the charge balance of the charge compensation device structure, the correction process towards a target charge balance may either dispense with additional proton implantation and decrease the number of n-type charges in the charge compensation device structure by an additional annealing process of the semiconductor substrate (c.f. FIG. 1E) or, in a case of excess p-type charges in charge compensation device structure, the number of n-type charges may be increased by additional proton implantation and annealing as illustrated in FIG. 1D, 1E and as described above. Furthermore, according to an embodiment, annealing the semiconductor substrate may be carried out with a thermal budget configured to deactivate at least a part of donors generated by proton irradiation and annealing, for example by breakup of electrically active hydrogen-vacancy complexes. Thereby, a concentration of hydrogen-related donors generated by proton irradiation and annealing may also be decreased.

Based on the electric characteristic $\alpha_i$ related to the charge compensation device structures, photon beam irradiation parameters with respect to different positions on the semiconductor wafer are adjusted. Local heating of the semiconductor wafer 105, and hence an extent of decrease of hydrogen-related donor concentration depends on thermal energy input into the semiconductor wafer 105 by absorption of the photon beam irradiation. As a photon beam irradiation source, any irradiation source may be used that is configured to emit radiation in such a way that absorption of the irradiation in the semiconductor wafer leads to a desired local heating. Some embodiments are based on laser beam irradiation. Some other embodiments are based on light emitting diode (LED) irradiation. Some other embodiments are based on light from ultraviolet (UV), infrared (IR) microwave, or visible light sources such as lamps. Beam focusing optical elements may be used to further adjust energy absorption or local heating in the semiconductor wafer. The thermal energy input into the semiconductor wafer 105 may vary across the surface of the semiconductor wafer 105 depending on the photon beam irradiation parameters, for example photon beam pulse length, photon beam pulse energy, number of photon beam pulses, time between photon beam pulses, wavelength of photon irradiation, photon beam optics, photon beam intensity. In some embodiments, pulse lengths are in a range of 10 ms to 400 ms, for example such that an energy deposition length in the range of one or several micrometers may be achieved. In some other embodiments, pulse lengths are chosen larger than 400 ms and also unpulsed photon irradiation may be used.

Figure 1F:
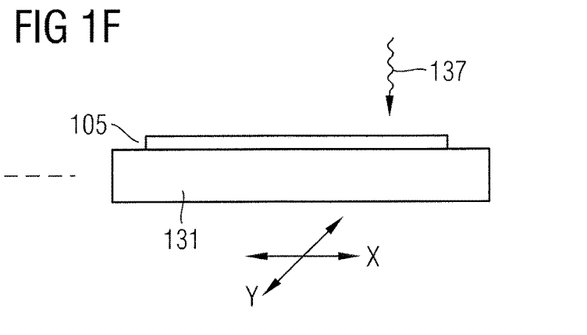

Referring to the schematic view of FIG. 1F, the semiconductor wafer 105 is irradiated with a photon beam 137 at the different positions on the semiconductor wafer 105 based on the photon beam irradiation parameters. Positioning the semiconductor wafer 105 at the different positions may be carried out by mounting the semiconductor wafer 105 on a XY stage 131 and moving the semiconductor wafer by the XY stage 131 with an X-drive and a Y-drive along an XY plane, for example. Laser beam irradiation may be carried out through a first surface of the semiconductor wafer 105, for example through a front side surface of the semiconductor wafer 105 where control structures such as gate structures are formed, or through a rear side surface where load terminal contacts such as a drain contact of an insulated gate field effect transistor or a collector contact of an insulated gate bipolar transistor are formed. In some other embodiments, irradiation of the semiconductor wafer 105 with the photon beam 137 is carried out through the front side surface and through the rear side surface starting with irradiation through the front side surface followed by irradiation through the rear side surface, or starting with irradiation through the rear side surface followed by irradiation through the front side surface. Between front- and rear side irradiation, the semiconductor wafer 105 may be turned on the XY stage 131. The XY stage 131 or another carrier for the semiconductor wafer may be pre-heated to a temperature below a temperature of breakup or electrical deactivation of electrically active hydrogen-vacancy complexes, i.e. electrical deactivation of hydrogen-related donors. In this case, the thermal budget to be introduced into the semiconductor wafer 105 for locally breaking up electrically active hydrogen-vacancy complexes is smaller than in the case where irradiation of the semiconductor wafer 105 is carried out in an ambient at room temperature. Pre-heating is beneficial with regard to achieving a homogeneous temperature distribution into a depth of the semiconductor wafer. In some embodiments pre-heating is carried out in a temperature range between 50° C. and 450° C., or between 100° C. and 350° C.

Since process tolerances lead to deviations of a target charge balance of a super-junction semiconductor device not only from wafer to wafer but also along a wafer, i.e. to a de-tuning of a desired degree of charge balance that may result in an undesirable decrease of device performance such as a reduction in a source to drain breakdown voltage, the above method allows for a correction or tuning of the charge balance of a super-junction semiconductor device over a surface of the semiconductor wafer 105 by varying irradiation parameters of local irradiation of the semiconductor wafer 105 along the lateral wafer direction, thereby varying a thermal budget introduced into the semiconductor wafer 105, and thus a degree of deactivation of electrically active hydrogen-vacancy complexes.

Figure 2:
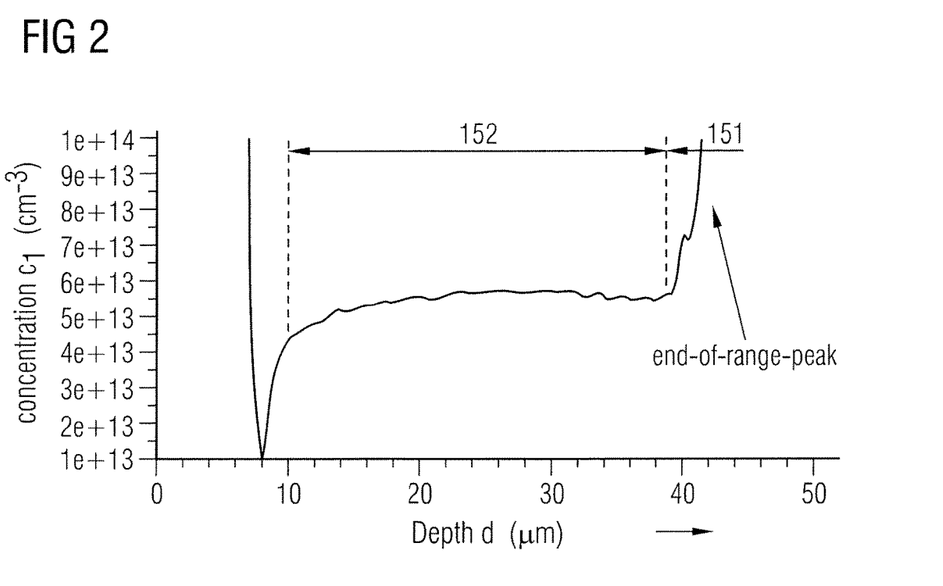
FIG. 2 is a schematic diagram illustrating one example of a profile of hydrogen-related donors generated by irradiating a semiconductor wafer, for example the semiconductor wafer illustrated in FIG. 1A with protons followed by an annealing process and a photon irradiation process.

FIG. 2 illustrates a measured profile of concentration $c_1$ of hydrogen-related donors versus a depth d of a semiconductor wafer. Proton irradiation occurred from a first side, e.g. along a direction of increasing values of depth d which may correspond to the direction y illustrated in FIG. 1B, for example. Diffusion of the hydrogen and the formation of donors due to creation of hydrogen/vacancy-complexes in an end-of-range area 151 by thermal processing leads to an almost homogeneous doping with hydrogen-related donors in an area 152. By appropriately adjusting parameters such as proton irradiation dose, proton irradiation energy, annealing temperature and annealing duration, the end-of-range area 151 may be adjusted to fall within a field stop zone or a highly doped substrate portion of a charge compensation device and the area 152 of almost homogeneous doping with hydrogen-related donors may be adjusted to fall within a voltage absorbing region, for example a drift zone of a charge compensation device structure of a charge compensation device.

Figure 3:
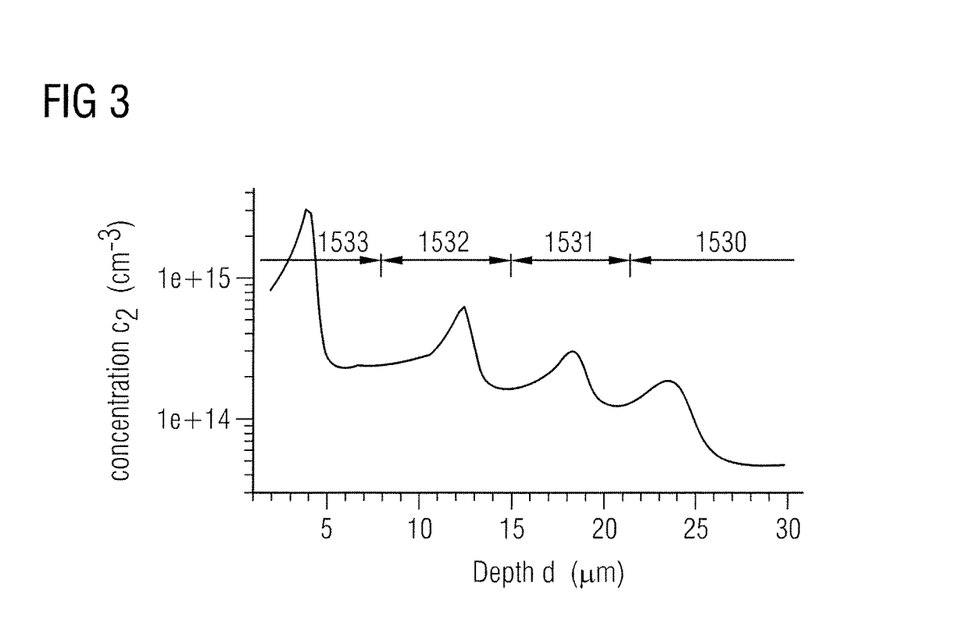
FIG. 3 is a schematic diagram illustrating another example of a profile of hydrogen-related donors generated by irradiating a semiconductor wafer, for example the semiconductor wafer illustrated in FIG. 1A multiple times with protons followed by an annealing process and photon irradiation process.

FIG. 3 illustrates a measured profile of concentration $c_2$ of hydrogen-related donors versus a depth d of a semiconductor wafer. Multiple proton irradiations occurred from the first side, e.g. along a direction of increasing values of depth d which may correspond to the direction y illustrated in FIG. 1B, for example. Diffusion of the hydrogen and the formation of donors due to the creation of hydrogen/vacancy-complexes in and between the end of range areas by thermal processing leads to overlapping profiles of hydrogen-related donors, whereas each one of peak areas 1530, 1531, 1532, 1533 is associated with a separate proton implantation process. The sequence of proton implantations illustrated in FIG. 3 with respect to the peak areas is e.g. 1530, 1531, 1532, 1533. A broadening of the profile in the peak area 1530 is larger than in the peak areas 1531, 1532, 1533. Likewise, a broadening of the profile in the peak area 1531 is larger than in the peak areas 1532, 1533 and a broadening of the profile in the peak area 1532 is larger than in the peak areas 1533 due to larger irradiation energies resulting in an increased width of the end-of-range peak.

By appropriately adjusting parameters such as proton irradiation dose, proton irradiation energy, annealing temperature and annealing duration, the peak areas 1530, 1531, 1532, 1533 may be adjusted with respect to peak height, broadening, depth of peak, overlap with neighboring peak areas, for example. By irradiating the semiconductor wafer with a photon beam at different positions on the semiconductor wafer based on photon beam irradiation parameters that may vary across the surface of the semiconductor wafer, adjustment of the peak areas 1530, 1531, 1532, 1533 with respect to peak height, broadening, depth of peak, overlap with neighboring peak areas, for example may vary across the surface of the semiconductor wafer depending on a desired degree of charge balance correction.

According to other embodiments, proton irradiation may be carried out from opposite sides such as the first and second sides 120, 128 illustrated in FIG. 1B.

Figure 4A:
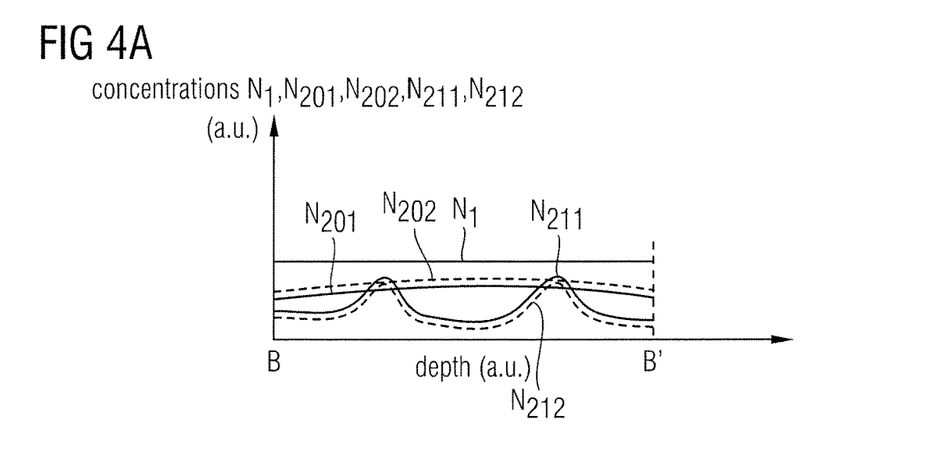
FIG. 4A is a schematic diagram illustrating embodiments of n-type dopant profiles including hydrogen-related donors along line B-B' of the semiconductor wafer illustrated in FIG. 1B with respect to different dies of the semiconductor wafer.

FIG. 4A is a schematic diagram illustrating embodiments of n-type dopant profiles along line B-B' of the semiconductor wafer 105 illustrated in FIG. 1B.

The illustrated dopant profile relates to the n-doped region 111. The n-doped region 111 includes a first concentration $N_1$ of n-type dopants. The dopant concentration $N_1$ may be formed by in-situ doping while manufacturing the charge compensation device structure, e.g. in-situ doping during epitaxial growth or deposition. In addition or as an alternative, the concentration $N_1$ may be formed by ion implantation of n-type dopants, e.g. when manufacturing the charge compensation device structure by a so-called multiple epitaxy technology or by a deep trench technology, for example. According to an embodiment, a dopant species of the dopant concentration $N_1$ may include one or more of phosphor (P), antimony (Sb) and arsenic (As). A profile of the first concentration $N_1$ of the n-type dopants may be almost constant or include an undulation which may be caused by multiple ion implantation processes of n-type dopants in the multiple epitaxy technology.

In addition to the first concentration $N_1$ of the n-type dopants, the n-doped region 111 further includes, according to an embodiment, second concentration profiles $N_{201}$, $N_{202}$ of hydrogen-related donors at two different positions on the wafer surface. The second concentration profile $N_{201}$ represents a profile of hydrogen-related donors at a first position on the surface of the semiconductor wafer after proton and photon beam irradiations, and the second concentration profile $N_{202}$ represents a profile of hydrogen-related donors at a second position on the surface of the semiconductor wafer after proton and photon beam irradiations. By varying the thermal budget locally introduced into semiconductor wafer by photon beam irradiation, a correction of charge balance may be varied across a surface of the semiconductor wafer based on the measured electric characteristic $\alpha_i$. Although FIG. 4A illustrates merely two different second concentration profiles having almost constant concentration values for illustration purposes, more than two different second concentration profiles may be present depending on a number of photon beam irradiation positions and different photon beam irradiation parameters for local correction of the charge balance across the wafer surface.

According to another embodiment, second concentration profiles $N_{211}$, $N_{212}$ of hydrogen-related donors may include multiple peaks due to overlapping profiles of hydrogen-related donors caused by multiple proton irradiations at different energies and photon beam irradiations at different positions on the wafer surface, for example. The second concentration profile $N_{211}$ represents a profile of hydrogen-related donors at a first position on the surface of the semiconductor wafer after proton and photon beam irradiations, and the second concentration profile $N_{212}$ represents a profile of hydrogen-related donors at a second position on the surface of the semiconductor wafer after proton and photon beam irradiations. By varying the thermal budget locally introduced into semiconductor wafer by photon beam irradiation, a correction of charge balance may be varied across a surface of the semiconductor wafer based on the measured electric characteristic $\alpha_i$. Although FIG. 4A illustrates merely two different second concentration profiles $N_{211}$, $N_{212}$ with multiple peaks for illustration purposes, more than two different second concentration profiles with multiple peaks may be present depending on a number of photon beam irradiation positions and different photon beam irradiation parameters for local correction of the charge balance across the wafer surface.

Figure 4B:
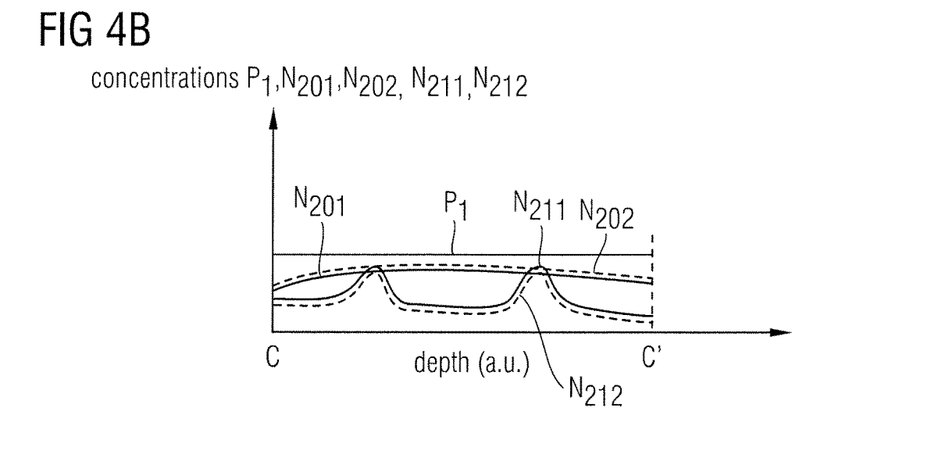
FIG. 4B is a schematic diagram illustrating embodiments of n-type and p-type dopant profiles including hydrogen-related donors along line C-C' of the semiconductor wafer illustrated in FIG. 1B with respect to different dies of the semiconductor wafer.

FIG. 4B is a schematic diagram illustrating embodiments of p-type and n-type dopant profiles along line C-C' of the semiconductor wafer 105 illustrated in FIG. 1B. A net doping along the line C-C' is p-type and relates to the p-doped region 112. The p-doped region 112 includes a first concentration $P_1$ of p-type dopants. The dopant concentration $P_1$ may be due to in-situ doping while manufacturing the charge compensation device structure, e.g. in-situ doping during epitaxial growth or deposition. In addition or as an alternative, the concentration $P_1$ may be due to ion implantation of p-type dopants, e.g. when manufacturing the charge compensation device structure by a so-called multiple epitaxy technology. According to an embodiment, a dopant species of the dopant concentration $P_1$ may include one or more of boron (B), indium (In), aluminum (Al), gallium (Ga). A profile of the first concentration $P_1$ of p-type dopants may be almost constant or include an undulation which may be caused by multiple ion implantation processes of p-type dopants in the multiple epitaxy technology. In addition to the first concentration $P_1$ of p-type dopants, the p-doped region 112 further includes, according to an embodiment, a counter-doping by the second concentration profile $N_{201}$ at a first position on the surface of the semiconductor wafer after proton and photon beam irradiations, and a counter-doping by the second concentration profile $N_{202}$ at a second position on the surface of the semiconductor wafer after proton and photon beam irradiations. The second concentration profiles $N_{201}$, $N_{202}$ of hydrogen-related donors are almost homogeneous and caused by a single proton implantation as illustrated, for example, in FIG. 2. The hydrogen-related donors constituting the second concentration may be simultaneously formed in the n-doped and p-doped regions 111, 112 for the same purpose of charge balance correction, for example.

According to another embodiment, the p-doped regions 112 further include second concentration profiles $N_{211}$, $N_{212}$ of hydrogen-related donors with multiple peaks due to overlapping profiles of hydrogen-related donors caused by multiple proton irradiations at different energies and photon beam irradiations, for example. A second concentration profile $N_{211}$ represents a profile of hydrogen-related donors at a first position on the surface of the semiconductor wafer after proton and photon beam irradiations, and a second concentration profile $N_{212}$ represents a profile of hydrogen-related donors at a second position on the surface of the semiconductor wafer after proton and photon beam irradiations. By varying the thermal budget locally introduced into the semiconductor wafer by photon beam irradiation, a correction of charge balance may be varied across a surface of the semiconductor wafer based on the measured electric characteristic $\alpha_i$. Although FIG. 4B illustrates merely two different second concentration profiles $N_{211}$, $N_{212}$ with multiple peaks for illustration purposes, more than two different second concentration profiles with multiple peaks may be present depending on a number of photon beam irradiation positions and different photon beam irradiation parameters for local correction of the charge balance across the wafer surface.

Figure 4C:
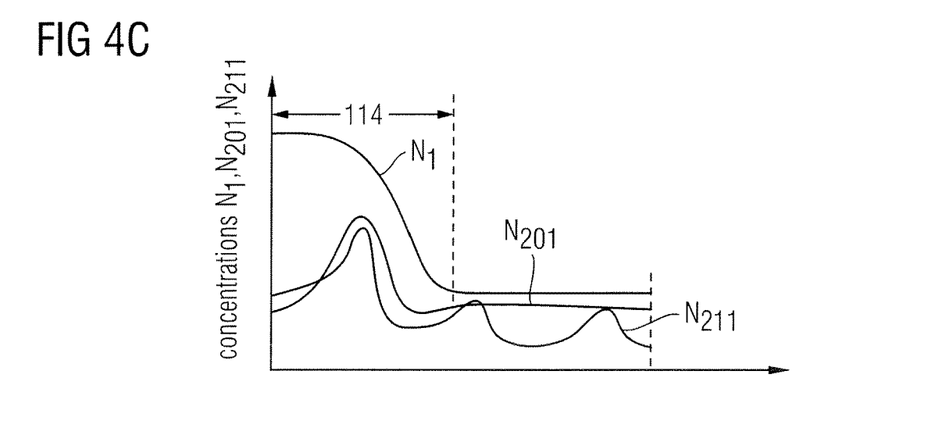
FIG. 4C is a schematic diagram illustrating embodiments of n-type dopant profiles including hydrogen-related donors along line D-D' of the semiconductor substrate illustrated in FIG. 1B with respect to one of the dies of the semiconductor wafer.

FIG. 4C is a schematic diagram illustrating embodiments of n-type dopant profiles along line D-D' of the semiconductor wafer 105 illustrated in FIG. 1B. The profile along line D-D' is an extension of the profile along the line C-C' into the optional n-doped field stop zone 114.

According to an embodiment, end-of-range peaks of the first concentrations $N_{201}$, $N_{211}$ of hydrogen-related donors are located within the optional n-doped field stop zone 114.

The method of charge balance correction illustrated in FIGS. 1A to 1E relates to a vertical charge compensation device including load terminals, e.g. source and drain at opposite first and second sides 120, 128 of the semiconductor wafer 105.

The method may also be applied to other device layouts. One example of another device layout is a lateral charge compensation or SJ FET 500 illustrated in FIG. 5. The lateral charge compensation FET 500 includes a charge compensation device structure including n-type and p-type regions 511, 512.

Figure 5:
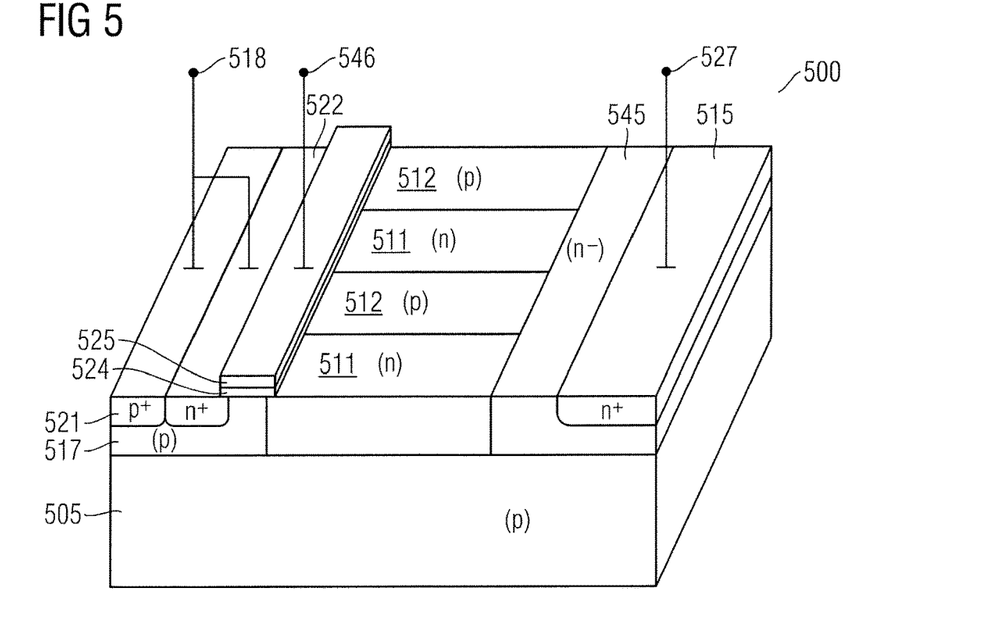
FIG. 5 is a schematic cross-sectional view of one embodiment of a lateral semiconductor device with a charge compensation structure including hydrogen-related donors in both of alternating p- and n-type regions of the charge compensation structure.

The n-type and p-type regions 511, 512 constitute a voltage absorbing drift zone arranged between an $n^+$-type source region 522 and an $n^+$-type drain region 515. The $n^+$-type source region 522 is arranged in a p-well 517. A source electrode 518 is electrically coupled to the p-well 517 via an optional $p^+$-type contact region 521 and to the $n^+$-type source region 522. A drain electrode 527 is electrically coupled to the $n^+$-type source region 522. The n-type regions 511 are electrically coupled to the $n^+$-type drain region 515 via an optional $n^-$-type drain extension region 545.

A planar gate structure including a gate dielectric 524 and a gate electrode 525 is arranged on the p-well 517 between the $n^+$-type source region 522 and the n-type and p-type regions 511, 512. A gate electrode contact 546 is electrically coupled to the gate electrode 525. In the illustrated embodiment of FIG. 5, the lateral charge compensation FET 500 is arranged on a p-type substrate 505. Charge balance correction in the n-type and p-type regions 511, 512 may be carried out as illustrated in FIGS. 1C to 1F and described above.

Figure 6:
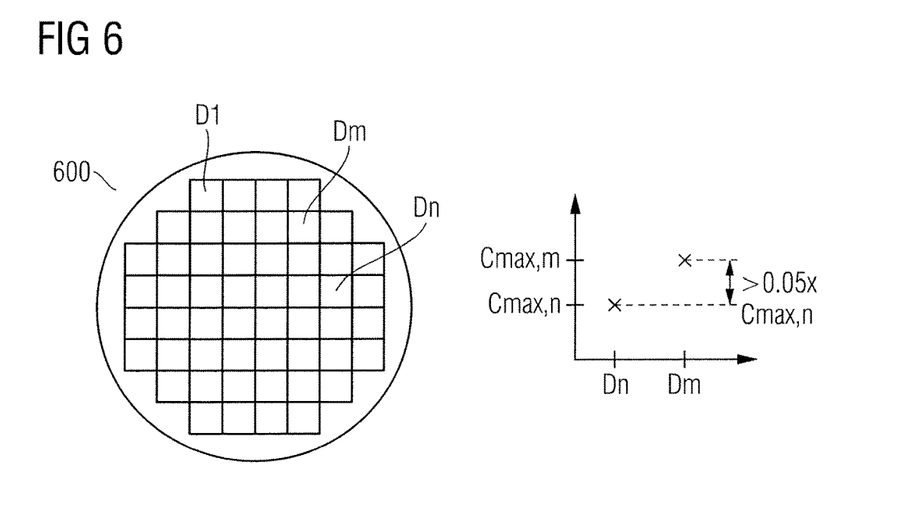
FIG. 6 is a schematic top view illustrating an embodiment of a semiconductor wafer including different doping profile of hydrogen-related donors in different semiconductor dies.

FIG. 6 is a schematic illustration of a top view of an embodiment of a semiconductor wafer 600 including a plurality of semiconductor dies, for example semiconductor dies denoted D1, Dm, Dn. Each of the plurality of semiconductor dies comprises a charge compensation structure including p-doped and n-doped regions arranged consecutively in a semiconductor substrate along a lateral direction. Examples of charge compensation structures are illustrated in FIGS. 1B and 5. A first dopant species dominates a doping profile of the p-doped regions. A second dopant species dominates a doping profile of the n-doped regions. Each of the plurality of semiconductor dies further comprises hydrogen-related donors in the p-doped and n-doped regions. The hydrogen-correlated donors differ from the second dopant species. Examples of doping profiles are illustrated in FIGS. 4A and 4B. A maximum concentration $c_{max,m}$ of the hydrogen-related donors in the p-doped regions of a first die of the plurality of semiconductor dies is more than 5% greater, or more than 10% greater, or more than 30% greater, or more than 50% greater than a maximum concentration $c_{max,n}$ of the hydrogen-related donors in the p-doped regions of a second die of the plurality of semiconductor dies. In some embodiments, each of the plurality of semiconductor dies comprises an n-doped field stop zone between the charge compensation structure and a second side of the semiconductor substrate. Within a range of the n-doped field stop zone, an end-of-range peak profile of hydrogen-related donors is smaller than a profile of another n-type dopant species of the n-doped field stop zone.

In some embodiments, the hydrogen-related donors extend over at least 30% or even at least 50% or even at least 80% of a vertical extension of a drift zone between a first side and a second side of the semiconductor substrate. In some embodiments, a concentration of the hydrogen-related donors is in a range of $1 \times 10^{13}$ cm$^{-3}$ and $5 \times 10^{16}$ cm$^{-3}$, or $2 \times 10^{13}$ cm$^{-3}$ and $1 \times 10^{16}$ cm$^{-3}$, or $5 \times 10^{13}$ cm$^{-3}$ and $1 \times 10^{15}$ cm$^{-3}$.

An embodiment refers to a method of manufacturing a semiconductor device. A charge compensation device structure is formed in a semiconductor substrate. An electric characteristic related to the charge compensation device is measured. At least one of proton irradiation and annealing parameters are adjusted based on the measured electric characteristic. Based on the at least one of the adjusted proton irradiation and annealing parameters the semiconductor substrate is irradiated with protons, wherein an end-of-range peak of the protons is located within the charge compensation structure, and thereafter, the semiconductor substrate is annealed.

By positioning the end-of-range peak of the protons within the charge compensation structure, i.e. between an upper side and a lower side of the charge compensation structure, a punch-through voltage of the compensation structure may be corrected and adjusted. Thereby, the voltage which is necessary so that a lower side part of the compensation structure is no longer electrically floating can be adjusted after measurement of the electric characteristic. In some embodiments, the electric characteristic related to the charge compensation device includes a measured characteristic of an output charge Qoss versus voltage, i.e. an Qoss(V) characteristic. In some embodiments, the Qoss(V) characteristic is measured with respect to the charge compensation structure and/or a test structure of one or more semiconductor dies of the semiconductor substrate. In some embodiments, the adjusted proton irradiation parameters include an implantation dose in a range of $1 \times 10^{13}$ cm$^{-2}$ and $3 \times 10^{15}$ cm$^{-2}$, or $5 \times 10^{13}$ cm$^{-2}$ and $1 \times 10^{15}$ cm$^{-2}$, or $2 \times 10^{14}$ cm$^{-2}$ and $8 \times 10^{14}$ cm$^{-2}$ and an implantation energy in a range of 500 keV and 3 MeV, or in a range of 1 MeV and 2 MeV.

In some embodiments, further proton irradiations may be carried out such that an end-of-range peak of the protons is located within the charge compensation structure, for example for precisely tuning the punch-through-voltage, or correcting a charge compensation balance, or for increasing avalanche robustness. The charge compensation structure may be formed by super junction process technologies such as multiple epitaxy technology and deep trench technology. Also a combination of multiple epitaxy technology and deep trench technology may be used to formed the charge compensation device structure.

According to an embodiment of a semiconductor device, the semiconductor device comprises a charge compensation structure including p-doped and n-doped regions arranged consecutively in a semiconductor substrate along a lateral direction. The semiconductor device further includes a first dopant species dominating a doping profile of the p-doped regions and a second dopant species dominating a doping profile of the n-doped regions. The semiconductor device further includes hydrogen-related donors in the p-doped and n-doped regions, wherein an end-of-range peak of the protons is located within the charge compensation structure. The hydrogen-related donors differ from the second dopant species. A maximum concentration $c_{max,m}$ of the hydrogen-related donors in the p-doped regions of a first die of the plurality of semiconductor dies is more than 5% greater, or more than 10% greater, or more than 30% greater, or more than 50% greater than a maximum concentration $c_{max,n}$ of the hydrogen-related donors in the p-doped regions of a second die of the plurality of semiconductor dies.

Figure 7A:
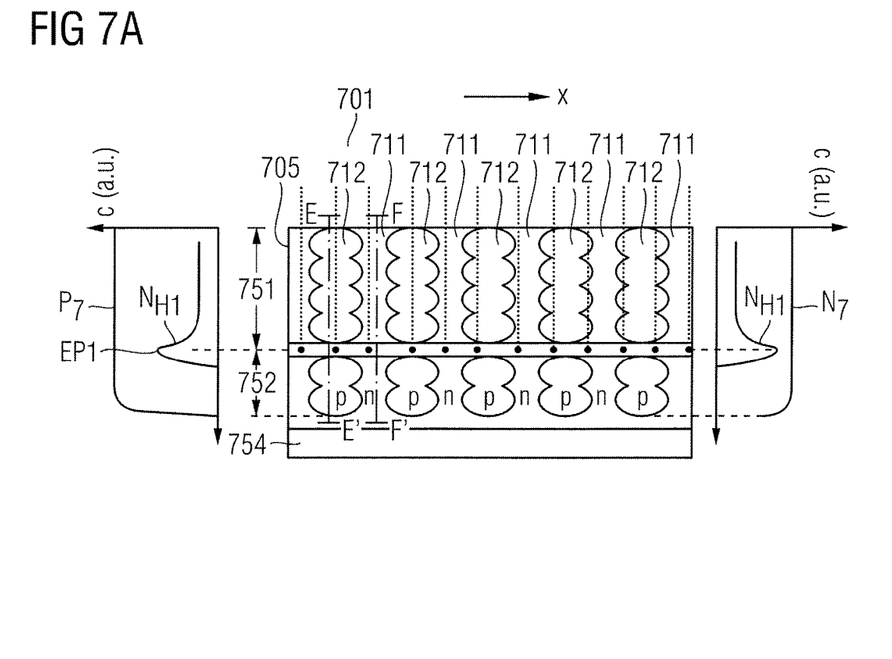
FIGS. 7A to 7E are schematic cross-sectional views of super junction semiconductor devices including an end-of-range peak of implanted hydrogen-related donors within a compensation structure.

FIG. 7A is a schematic cross-sectional view of a semiconductor device 701 comprising a charge compensation structure including n-doped and p-doped regions 711, 712 arranged consecutively in a semiconductor substrate 705 along a lateral direction x. The charge compensation structure is based on multiple epitaxy technology in an upper part 751 and is based on multiple epitaxy technology in a lower part 752. In other words, the charge compensation structure illustrated in FIG. 7A includes multiple inter-diffused p-type sub-regions subsequently arranged along a vertical direction between opposite main surfaces of the semiconductor substrate. A first p-dopant species dominates a doping profile of the p-doped regions 712 and a second n-dopant species dominates a doping profile of the n-doped regions 711. The semiconductor device 701 further includes hydrogen-related donors in the n-doped and p-doped regions 711, 712, wherein an end-of-range peak of the protons is located within the charge compensation structure. Examples of doping profiles are illustrated next to the schematic cross-sectional view. An exemplary doping profile along line E-E' through one the p-doped regions 712 is illustrated in the graph to the left of the cross-sectional view illustrating concentration c versus depth, $P_7$ representing a doping profile of the first p-dopant species, whereas an exemplary doping profile along line F-F' through one the n-doped regions 711 is illustrated in the graph to the right of the cross-sectional view illustrating concentration c versus depth, $N_7$ representing a doping profile of the second n-dopant species, and $N_{H1}$ representing a doping profile of the hydrogen-related donors in the n-doped and p-doped regions 711, 712, wherein an end-of-range peak EP1 of the protons is located within the charge compensation structure between the upper and lower parts 751, 752. Alternatively, the n-type interruption of the compensation regions 711, 712 may be completely realized by the end-of-range of the protoninduced doping process. Alternatively, the end-of-range peak may be arranged within the lower part 752 of the compensation structure.

Proton implantation into the semiconductor substrate 705 is schematically illustrated by dashed lines ending in an area of the end-of-range peak EP1. The semiconductor device 701 may further comprise a field stop zone 754 below the charge compensation structure.

Figure 7B:
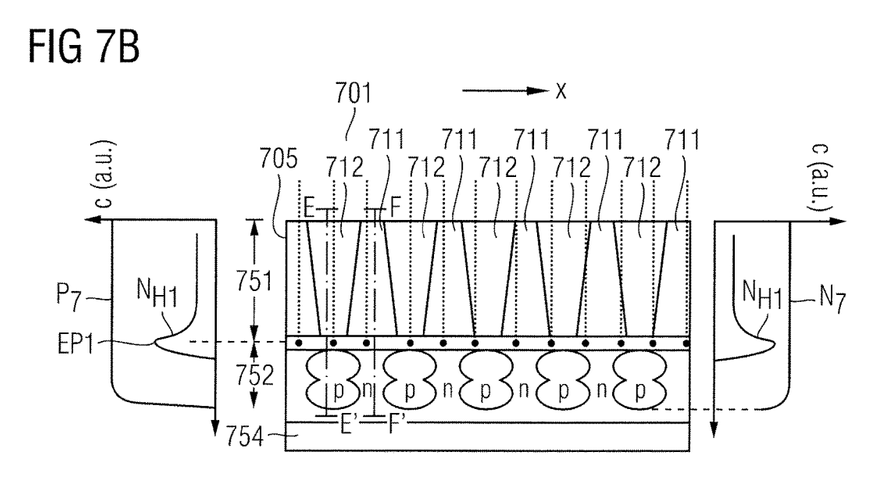

FIG. 7B is a schematic cross-sectional view of a semiconductor device 702 differing from the embodiment of FIG. 7A in that the upper part 751 of the compensation structure is based on deep trench technology.

Figure 7C:
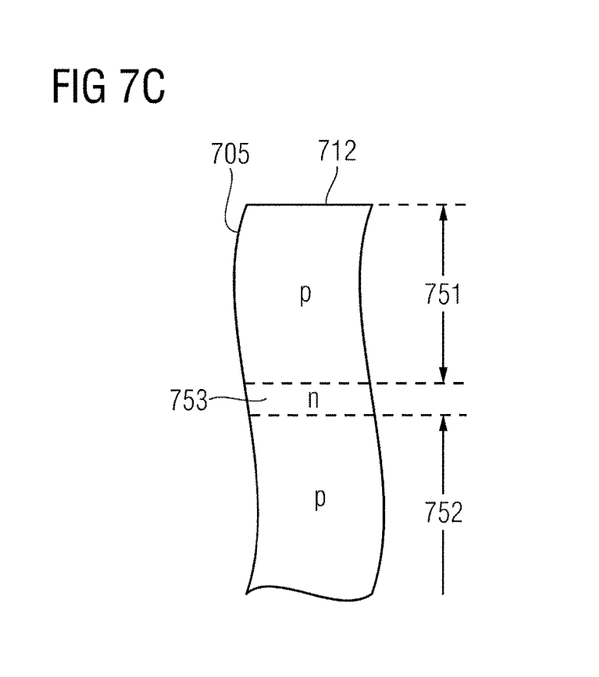

In the embodiments described above with respect to FIGS. 7A and 7B, multiple inter-diffused p-type sub-regions are subsequently arranged along a vertical direction between opposite main surfaces of the semiconductor substrate. In some other embodiments, the upper and lower parts 751, 752 of the compensation structure in an area of the p-doped regions 712 is interrupted by an n-doped region 753 as is illustrated in the schematic cross-sectional view of FIG. 7C. In the n-doped region, an end-of-range peak of the protons is located, and an doping of hydrogen-related donors caused by proton irradiation and annealing and a background n-doping is greater than any p-doping present in this region.

Figure 7D:
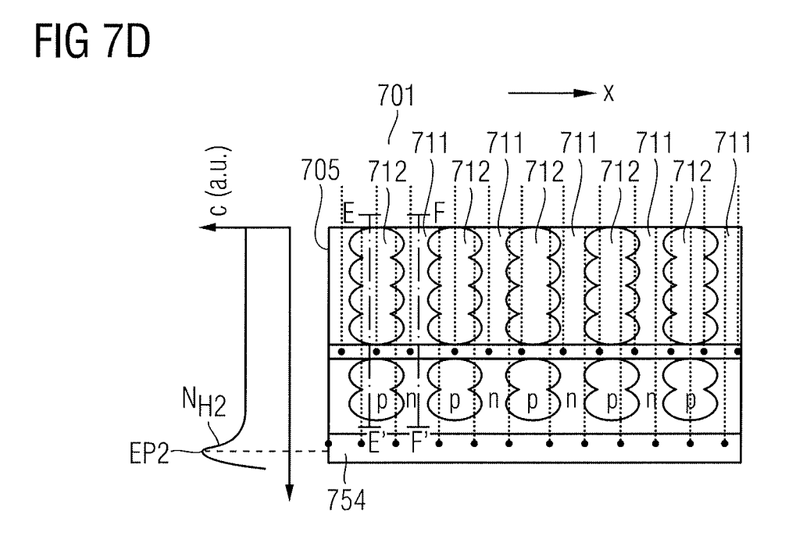
Figure 7E:
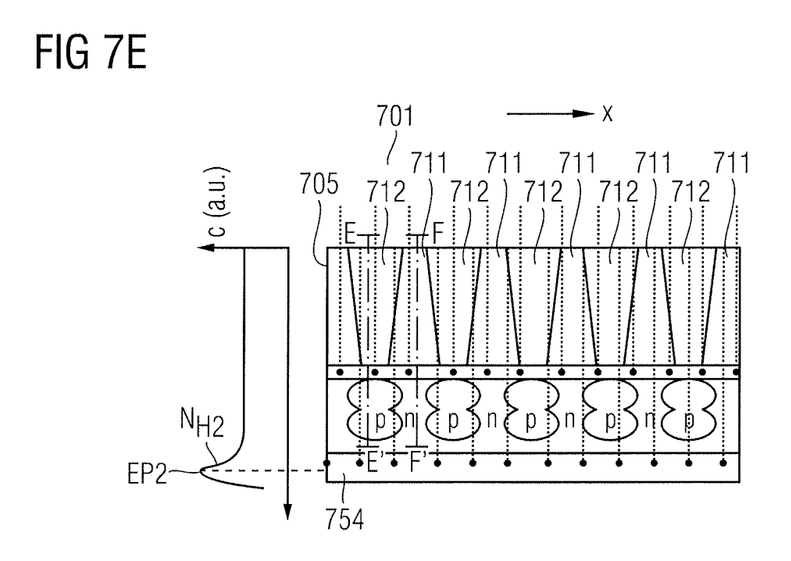

As is illustrated in the schematic cross-sectional views of FIG. 7D and FIG. 7E, one or more further proton implantations may be carried out based on ion implantation and annealing parameters determined by the measured electric characteristic related to the charge compensation device, which may, in addition to or as an alternative to a Qoss(V) characteristic, include a breakdown voltage characteristic at one or more positions across a surface of the semiconductor substrate. The one or more further proton implantations may lead to a profile $N_{H2}$ representing a doping profile of the hydrogen-related donors outside of the p-doped and n-doped regions 712, 711, wherein an end-of-range peak EP2 of the protons is located within the field stop zone 754. According to an embodiment, at least one of number, dose and energy of proton irradiation are adjusted based on the measured value of the electric characteristic. According to an embodiment, the adjusted proton irradiation parameters for profile $N_{H2}$ include an implantation dose in a range of $2 \times 10^{14}$ cm$^{-2}$ and $8 \times 10^{14}$ cm$^{-2}$ and an implantation energy in a range of 1.0 MeV and 3.0 MeV. According to an embodiment, the adjusted proton irradiation parameters for profile $N_{H2}$ are configured to shift a charge balance of the charge compensation device structure based on the measured value of the electric characteristic towards or to a target charge balance of the charge compensation device structure.

In some embodiments, by varying a thermal budget locally introduced into the semiconductor substrate 705 by photon beam irradiation as described in the embodiments above, for example with respect to FIG. 1F, a correction of charge balance may be varied across a surface of the semiconductor substrate 705 based on the measured electric characteristic.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor wafer, comprising:
a plurality of semiconductor dies, each of the plurality of semiconductor dies comprising
a charge compensation structure having a planar bottom surface including p-doped and n-doped regions, the p-doped and n-doped regions arranged consecutively in a semiconductor substrate along a lateral direction;
a first dopant species dominating a doping profile of the p-doped regions;
a second dopant species dominating a doping profile of the n-doped regions;
hydrogen-related donors in the p-doped and n-doped regions, wherein the hydrogen-related donors differ from the second dopant species; and wherein
a maximum concentration of the hydrogen-related donors in the p-doped regions of a first die of the plurality of semiconductor dies is more than 5% greater than a maximum concentration of the hydrogen-related donors in the p-doped regions of a second die of the plurality of semiconductor dies; and
an n-doped field stop zone between the charge compensation structure and a second side of the semiconductor substrate having a planar top surface in physical contact with the planar bottom surface of the charge compensation structure, and
wherein, within a range of the n-doped field stop zone, an end-of-range peak profile of hydrogen-related donors is smaller than a profile of another n-type dopant species of the n-doped field stop zone.

2. The semiconductor wafer of claim 1, wherein the hydrogen-related donors extend over at least 30% of a vertical extension of a drift zone between a first side and a second side of the semiconductor substrate.

3. The semiconductor wafer of claim 1, wherein a concentration of the hydrogen-related donors in the p-doped regions of each of the first die and the second die of the plurality of semiconductor dies is in a range of $1 \times 10^{13}$ cm$^{-3}$ and $5 \times 10^{16}$ cm$^{-3}$.

4. The semiconductor wafer of claim 1, wherein the charge compensation structure includes upper and lower parts in an area of the p-doped regions, the upper and lower parts being interrupted by an n-doped intermediate region sandwiched between the upper and lower parts.

5. The semiconductor wafer of claim 4, wherein a peak concentration of the hydrogen-related donors is located in the n-doped intermediate region.

* * * * *